United States Patent
Happ et al.

(10) Patent No.: US 9,871,155 B2
(45) Date of Patent: Jan. 16, 2018

(54) LAYER SYSTEM FOR THIN-FILM SOLAR CELLS HAVING AN $Na_xIn_1S_yCl_z$ BUFFER LAYER

(71) Applicant: Saint-Gobain Glass France, Courbevoie (FR)

(72) Inventors: Thomas Happ, München (DE); Stefan Jost, München (DE); Jörg Palm, München (DE); Stephan Pohlner, München (DE); Thomas Dalibor, Herrsching am Ammersee (DE); Roland Dietmüller, München (DE)

(73) Assignee: Bengbu Design & Research Institute for Glass Industry, Bengbu (CN)

( * ) Notice: Subject to any disclaimer, the term of this patent is extended or adjusted under 35 U.S.C. 154(b) by 0 days.

(21) Appl. No.: 14/409,669

(22) PCT Filed: Jun. 19, 2013

(86) PCT No.: PCT/EP2013/062703
§ 371 (c)(1),
(2) Date: Dec. 19, 2014

(87) PCT Pub. No.: WO2013/189968
PCT Pub. Date: Dec. 27, 2013

(65) Prior Publication Data
US 2015/0295105 A1    Oct. 15, 2015

(30) Foreign Application Priority Data

Jun. 20, 2012    (EP) .................................... 12172699

(51) Int. Cl.
*H01L 31/032* (2006.01)
*H01L 31/0392* (2006.01)
*H01L 31/18* (2006.01)

(52) U.S. Cl.
CPC ...... *H01L 31/0322* (2013.01); *H01L 31/0326* (2013.01); *H01L 31/03923* (2013.01);
(Continued)

(58) Field of Classification Search
CPC ............. H01L 31/0322; H01L 31/0324; H01L 31/0326; H01L 31/03923; H01L 31/03928; Y02E 10/541
(Continued)

(56) References Cited

U.S. PATENT DOCUMENTS 5,626,688 A    5/1997    Probst et al.
6,486,391 B2    11/2002    Karg
(Continued)

FOREIGN PATENT DOCUMENTS

JP    2011-204810 A    10/2011

OTHER PUBLICATIONS

Lauermann, I., et al., Synchrotron-based spectroscopy for the characterization of surfaces and interfaces in chalcopyrite thin-film solar cells, Solar Energy Materials and Solar Cells, Dec. 17, 2010, vol. 95, No. 6, pp. 1495-1508.
(Continued)

*Primary Examiner* — James Lin
*Assistant Examiner* — Dujuan A Horton
(74) *Attorney, Agent, or Firm* — Hodgson Russ LLP

(57) ABSTRACT

The present invention relates to a layer system (1) for thin-film solar cells with an absorber layer (4) that contains a chalcogenide compound semiconductor and a buffer layer (5) that is arranged on the absorber layer (4), wherein the buffer layer (5) contains $Na_xIn_1S_yCl_z$ with $0.05 \le x < 0.2$ or $0.2 < x \le 0.5$, $1 \le y \le 2$, and $0.6 \le x/z \le 1.4$.

19 Claims, 9 Drawing Sheets

Figure 1:
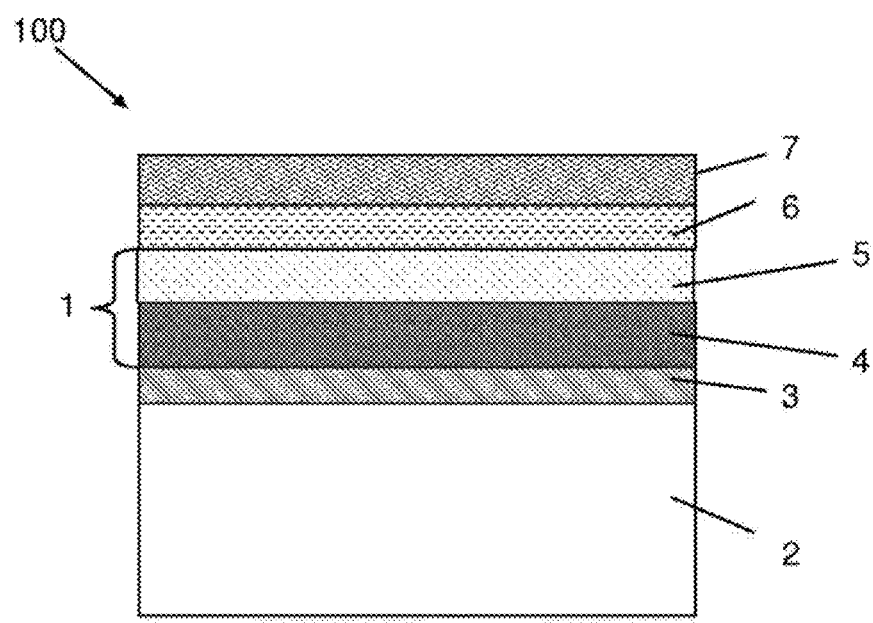

(52) U.S. Cl.
CPC ............ *H01L 31/18* (2013.01); *Y02E 10/541* (2013.01); *Y02P 70/521* (2015.11)

(58) Field of Classification Search
USPC ........................................ 136/256, 262, 264
See application file for complete search history.

(56) References Cited

U.S. PATENT DOCUMENTS

| | | |
|---|---|---|
| 8,148,631 B2 | 4/2012 | Fix et al. |
| 8,962,995 B2 | 2/2015 | Palm |
| 2009/0235987 A1 | 9/2009 | Akhtar et al. |
| 2010/0247745 A1 | 9/2010 | Rudmann et al. |

OTHER PUBLICATIONS

Bar, M., et al., Deposition of In2S3 on Cu(In,Ga)(S,Se)2 thin film solar cell absorbers by spray ion layer gas reaction: Evidence of strong interfacial diffusion, Applied Physics Letters, Mar. 29, 2007, vol. 90, No. 13, pp. 132188-1-132188-3.

Barreau, N., et al., A study of bulk NaxCu1 xIn5S8 and its impact on the Cu(In,Ga)Se2/In2S3 interface of solar cells, Solar Energy Materials and Solar Cells, Jul. 24, 2006, vol. 90, No. 12, pp. 1840-1848.

Sebastian, T., Automation of Chemical Spray Pyrolysis Unit and Fabrication of Sprayed CuInS2/In2S3 Solar Cell, Dissertation, Cochin University of Science and Technology, Thin Film Photovoltaic Division, Department of Physics, Aug. 2009, 154 pages.

Eicke, A., et al., Chemical charactherisation of evaporated In2Sx buffer layers in Cu(In,Ga)Se2 thin-film solar cells with SNMS and SIMS, Surface and Interface Analysis, Mar. 26, 2008, vol. 40, Nos. 3-4, pp. 830-833.

Naghavi, N., et al., Buffer layers and transparent conducting oxides for chalcopyrite Cu(In,Ga)(S,Se)2 based thin film photovoltaics: present status and current developments, Progress in Photovoltaics: Research and Applications, Aug. 24, 2010, vol. 18, No. 6, pp. 411-433.

Ladonf, A., et al., Structural study and electronic band structure investigations of the solid solution NaxCu1-xIn5S8 and its impact on the Cu(In,Ga)Se2/In2S3 interface of solar cells, Thin Solid Films, Jan. 19, 2007, vol. 515, No. 15, pp. 6020-6023.

Ewing, C.T., et al., Equilibrium Vaporization Rates and Vapor Pressures of Solid and Liquid Sodium Chloride, Potassium Chloride, Potassium Bromide, Cesium Iodide, and Lithium Fluoride, J. Phys. Chem., 1974, vol. 78, No. 20, pp. 1998-2005.

A)

B)

LAYER SYSTEM FOR THIN-FILM SOLAR CELLS HAVING AN $NA_xIN_1S_yCL_z$ BUFFER LAYER

The present invention relates to a layer system for thin-film solar cells and a method for producing a layer system.

Thin-film systems for solar cells and solar modules are sufficiently known and available on the market in various designs depending on the substrate and the materials applied thereon. The materials are selected such that the incident solar spectrum is utilized to the maximum. Due to the physical properties and the technological handling qualities, thin-film systems with amorphous, micromorphous, or polycrystalline silicon, cadmium telluride (CdTe), gallium arsenide (GaAs), copper indium (gallium) selenide sulfide ($Cu(In,Ga)(S,Se)_2$), and copper zinc tin sulfoselenide (CZTS from the group of the kesterites) as well as organic semiconductors are particularly suited for solar cells. The pentenary semiconductor $Cu(In,Ga)(S,Se)_2$ belongs to the group of chalcopyrite semiconductors that are frequently referred to as CIS (copper indium diselenide or copper indium disulfide) or CIGS (copper indium gallium diselenide, copper indium gallium disulfide, or copper indium gallium disulfoselenide). In the abbreviation CIGS, S can represent selenium, sulfur, or a mixture of the two chalcogens.

Current thin-film solar cells and solar modules based on $Cu(In,Ga)(S,Se)_2$ require a buffer layer between a p-conductive $Cu(In,Ga)(S,Se)_2$ absorber layer and an n-conductive front electrode. The front electrode usually includes zinc oxide (ZnO). According to current knowledge, this buffer layer enables electronic adaptation between the absorber material and the front electrode. Moreover, it offers protection against sputtering damage in the subsequent process step of deposition of the front electrode by DC-magnetron sputtering. Additionally, by constructing a high-ohm intermediate layer between p- and n-semiconductors, it prevents current drain from electronically good conductive zones into poor conductive zones.

To date, cadmium sulfide (CdS) has been most frequently used as a buffer layer. To be able to produce good efficiency of the cells, cadmium sulfide has, to date, been deposited in a chemical bath process (CBD process), a wet chemical process. However, associated with this is the disadvantage that the wet chemical process does not fit well into the process cycle of the current production of $Cu(In,Ga)(S,Se)_2$ thin-film solar cells.

A further disadvantage of the CdS-buffer layer consists in that it includes the toxic heavy metal cadmium. This creates higher production costs since increased safety precautions must be taken in the production process, e.g., in the disposal of wastewater. The disposal of the product can cause higher costs for the consumer since, depending on local legislation, the manufacturer could be compelled to take back, dispose of, or recycle the product. The resultant costs would be passed on to the consumers.

Consequently, various alternatives to the buffer made of cadmium sulfide have been tested for different absorbers from the family of the $Cu(In,Ga)(S,Se)_2$ semiconductors, e.g., sputtered ZnMgO, Zn(S,OH) deposited by CBD, In(O, OH) deposited by CBD, and indium sulfide deposited by atomic layer deposition (ALD), ion layer gas deposition (ILGAR), spray pyrolysis, or physical vapor deposition (PVD) processes, such as thermal deposition or sputtering. However, these materials still are not suitable as buffers for solar cells based on $Cu(In,Ga)(S,Se)_2$ for commercial use, since they do not achieve the same efficiencies as those with a CdS buffer layer. The efficiency describes the ratio of incident power to the electrical power produced by a solar cell and is as much as roughly 20% for CdS buffer layers for lab cells on small surfaces and between 10% and 15% for large-area modules. Moreover, alternative buffer layers present excessive instabilities, hysteresis effects, or degradations in efficiency when they are exposed to light, heat, and/or moisture.

A further disadvantage of CdS buffer layers is based on the fact that cadmium sulfide is a direct semiconductor with a direct electronic bandgap of roughly 2.4 eV. Consequently, in a $Cu(In,Ga)(S,Se)_2/CdS/ZnO$ solar cell, already with CdS-film thicknesses of a few 10 nm, the incident light is, to a large extent, absorbed. The light absorbed in the buffer layer is lost for the electrical yield since the charge carriers generated in this layer recombine right away and there are many crystal defects in this region of the heterojunction and in the buffer material acting as recombination centers. As a result, the efficiency of the solar cell is reduced, which is disadvantageous for a thin-film solar cell.

A layer system with a buffer layer based on indium sulfide is, for example, known from WO 2009141132 A2. The layer system comprises a chalcopyrite absorber of the CIGS family, and, in particular, of $Cu(In,Ga)(S,Se)_2$ in conjunction with a buffer layer of indium sulfide. The indium sulfide ($In_vS_w$) buffer layer has, for example, a slightly indium-rich composition with v/(v+w)=41% to 43%. The indium sulfide buffer layer can be deposited with various non-wet chemical methods, for example, by thermal deposition, electron beam deposition, ion layer gas reaction (ILGAR), cathode sputtering (sputtering), atomic layer deposition (ALD), or spray pyrolysis.

However, in the development to date of these layer systems and of the production method, it has been demonstrated that the efficiency of solar cells with an indium sulfide buffer layer is lower than that with CdS buffer layers.

Iver Lauermann et al.: "Synchrotron-based spectroscopy for the characterization of surfaces and interfaces in chalcopyrite thin-film solar cells", Solar Energy Materials and Solar Cells, Elsevier Science Publishers, Amsterdam, NL, Vol. 95, No. 6, 17 Dec. 2010, pp 1495-1508, shows a layer system with an Na-containing buffer layer, wherein the Na-content lies outside the range claimed in the present invention. The ranges claimed in the invention cannot be obtained with the arrangement of Lauermann et al.

Bär M. et al.: "Deposition of $In_2S_3$ on $Cu(In,Ga)(S,Se)_2$ thin film solar cell absorbers by spray ion layer gas reaction: Evidence of strong interfacial diffusion", Applied Physics Letters, AIP, American Institute of Physics, Melville, NY, US, Vol. 90, No. 13, 29 Mar. 2007, pp 132118-1-132118-3, shows a layer system with an Na-containing buffer layer, wherein the Na-content lies outside the range claimed in the present invention. The ranges claimed in the invention cannot be obtained with the arrangement of Bär et al.

Consequently, the object of the present invention is to provide a layer system based on a chalcogenide compound semiconductor with a buffer layer that has a high level of efficiency and high stability, with production that is economical and environmentally safe.

This object is accomplished according to the invention by a layer system according to claim 1. Advantageous improvements of the invention emerge from the subclaims.

The invention further includes a method for producing a layer system for thin-film solar cells.

A use of the layer system according to the invention is presented in further claims.

The layer system according to the invention comprises at least
  an absorber layer that includes a chalcogenide compound semiconductor and
  a buffer layer that is arranged on the absorber layer, wherein the buffer layer includes $Na_xIn_1S_yCl_z$ with $0.05 \leq x < 0.2$ or $0.2 < x \leq 0.5$, $1 \leq y \leq 2$, and $0.6 \leq x/z \leq 1.4$.

In the layer system according to the invention, the value $x=0.2$ is excluded for the sodium content.

As investigations of the inventors surprisingly showed, it was possible to measure a clear increase in the efficiency of solar cells through the addition of sodium and chlorine in an indium sulfide-containing buffer layer.

Since the elements of the buffer layer can, in each case, be present in different oxidation states, all oxidation states are referred to in the following with the name of the element unless explicitly indicated otherwise. Consequently, the term sodium, for example, means elemental sodium and sodium ions as well as sodium in compounds.

The index x indicates the ratio of the amount of sodium to the amount of indium in the buffer layer and is critical for the efficiency of the solar cell. A clear increase in the efficiency compared to pure indium sulfide buffer layers was already measured in a range of $0.05 \leq x \leq 0.5$.

In an advantageous embodiment of the layer system according to the invention $0.1 \leq x < 0.2$ or $0.2 < x \leq 0.3$. For these values, it was possible to measure particularly high efficiencies of as much as 15%.

The optimum amount of sodium in the buffer layer is clearly above the total amount of sodium in the absorber layer. The amount of sodium in the absorber layer is, however, dependent on the production process. Sodium from the absorber layer is relatively mobile. The inventors assume that the simultaneous supplying of sodium and chlorine binds the sodium in the buffer layer. At the same time, the presence of sodium in the buffer layer prevents the outward diffusion of sodium from the absorber layer into the buffer layer.

The index y is from 1 to 2. The index y indicates the ratio of the amount of sulfur to the amount of indium. In an advantageous embodiment of the layer system according to the invention $1.3 \leq y \leq 1.5$. For these values, it was possible to measure particularly high efficiencies. Particularly high efficiencies were measured for buffer layers that were slightly indium-rich. Here, "indium-rich" means that the relative proportion of indium to sulfur is greater than in the stoichiometric ratio of $In_2S_3$ and thus $y<1.5$ holds. In another advantageous embodiment of the invention, the buffer layer is implemented amorphous.

The ratio $x/z$ is from 0.6 to 1.4 and preferably from 0.8 to 1.2. For these values, it was possible to measure particularly high efficiencies. When sodium and chlorine are added from sodium chloride, the ratio $x/z$ is roughly 1. Slightly higher sodium fractions can result, for example, from inward diffusion of sodium out of the absorber layer or a glass substrate.

For the range of $0.05 \leq x \leq 0.5$, the mole fraction of sodium chloride in the buffer layer is approx. from 2 atom-% to 20 atom-%. For example, the mole fraction of sodium chloride in the buffer layer for $x=0.2$, $y=1.4$ and $x/z=1$ is roughly 7.1 atom-%. Here, the mole fraction in atom-% means the fraction of the amount of a substance based on the sum of the amount of substances of all elements of the buffer layer.

An advantageous embodiment of the buffer layer according to the invention has a layer thickness from 10 nm to 100 nm and preferably from 20 nm to 60 nm.

In another advantageous embodiment, the buffer layer according to the invention contains a mole fraction of oxygen of $\leq 10$ atom-%. Oxygen can appear as an impurity since materials used, for example, indium sulfide and sodium chloride, are hygroscopic. Oxygen can also be introduced via residual water vapor from the coating equipment. By means of a mole fraction $\leq 10$ atom-% of oxygen in the buffer layer, high efficiency of the solar cell can be ensured.

In another advantageous embodiment, the buffer layer according to the invention contains a mole fraction of copper of $\leq 10$ atom-%. Copper can diffuse into the buffer layer from the absorber layer. The inward diffusion of relatively large amounts of copper is, however, disadvantageous since the bandgap of the buffer layer is reduced by copper. This results in increased absorption of light in the buffer layer and, thus, in a reduction in efficiency. As experiments of the inventors have shown, the use of sodium in the buffer layer results in an advantageous inhibition of inward diffusion of copper into the buffer layer. This can be explained by the fact that sodium and copper assume the same sites in the indium sulfide lattice and these sites are occupied by sodium. By means of a mole fraction of copper in the buffer layer $\leq 10$ atom-%, high efficiency of the solar cell can be ensured.

In an advantageous embodiment of the layer structure according to the invention, the buffer layer has no substantial fraction of other elements besides sodium, chlorine, indium, sulfur, oxygen, and copper. This means that the buffer layer is not provided with other elements such as, for instance, carbon, and contains at most mole fractions of other elements of $\leq 1$ atom-% unavoidable due to production technology. Thus, high efficiency of the solar cell can be ensured.

In an advantageous embodiment of the layer system according to the invention, the local fraction of sodium and chlorine in the buffer layer has a non-constant depth profile. In the context of the present invention, "depth profile" describes the direction orthogonal to the layers of the layer structure, which means the direction parallel to the thickness of the individual layers of the layer structure. In particular, the fraction of sodium and chlorine in the buffer layer has a gradient that decreases from the surface facing the absorber layer to the interior of the buffer layer. The mole fractions of the individual elements in the entire buffer layer remain within the ranges claimed in the invention.

In an advantageous embodiment of the layer system according to the invention, the absorber layer contains as chalcogenide compound semiconductors $Cu_2ZnSn(S,Se)_4$ or $Cu(In,Ga,Al)(S,Se)_2$ and preferably $CuInSe_2$, $CuInS_2$, $Cu(In,Ga)Se_2$, or $Cu(In,Ga)(S,Se)_2$. In another advantageous embodiment of the layer system according to the invention, the absorber layer consists substantially of the chalcogenide compound semiconductor $Cu_2ZnSn(S,Se)_4$ or $Cu(In,Ga,Al)(S,Se)_2$ and preferably of $CuInSe_2$, $CuInS_2$, $Cu(In,Ga)Se_2$, or $Cu(In,Ga)(S,Se)_2$.

Another aspect of the invention comprises solar cells, in particular, thin-film solar cells with the layer system according to the invention and solar cell modules that include these solar cells.

A thin-film solar cell according to the invention comprises at least:
  a substrate,
  a rear electrode that is arranged on the substrate,
  a layer system according to the invention that is arranged on the rear electrode, and
  a front electrode that is arranged on the second buffer layer.

The substrate is preferably a metal, glass, plastic, or ceramic substrate, with glass being preferable. However, other transparent carrier materials, in particular plastics, can be used.

The rear electrode advantageously includes molybdenum (Mo) or other metals. In an advantageous embodiment of the rear electrode, it has a molybdenum sublayer adjoining the absorber layer and a silicon nitride sublayer (SiN) adjoining the molybdenum sublayer. Such rear electrode systems are known, for example, from EP 1356528 A1.

The front electrode preferably includes a transparent conductive oxide (TCO), particularly preferably aluminum-, gallium-, or boron-doped zinc oxide and/or indium tin oxide (ITO).

In an advantageous embodiment of the solar cell according to the invention, a second buffer layer is arranged between the buffer layer and the front electrode. The second buffer layer preferably includes non-doped zinc oxide and/or non-doped zinc magnesium oxide.

The invention further includes a method for producing a layer system according to the invention, wherein at least
  a) an absorber layer is prepared, and
  b) a buffer layer is arranged on the absorber layer,
wherein the buffer layer contains $Na_xIn_1S_yCl_z$ with $0.05 \leq x < 0.2$ or $0.2 < x \leq 0.5$, $0.6 \leq x/z \leq 1.4$, and $1 \leq y \leq 2$.

Expediently, the absorber layer is applied in an RTP ("rapid thermal processing") process on the rear electrode on a substrate. For $Cu(In,Ga)(S,Se)_2$ absorber layers, a precursor layer is first deposited on the substrate with the rear electrode. The precursor layer includes the elements copper, indium, and gallium, which are applied by sputtering. At the time of the coating with the precursor layer, a specific sodium dose is introduced into the precursor layers, as is known, for example, from EP 715 358 B1. In addition, the precursor layer contains elemental selenium that is applied by thermal deposition. During these processes, the substrate temperature is below 100° C. such that the elements substantially remain unreacted as metal alloys and elemental selenium. Then, this precursor layer is reacted by rapid thermal processing (RTP) in a sulfur-containing atmosphere to form a $Cu(In,Ga)(S,Se)_2$ chalcopyrite semiconductor.

In principle, for the production of the buffer layer, all chemical-physical deposition methods in which the ratio of sodium to chlorine as well as the ratio of the sodium chloride fraction to the indium sulfide fraction can be controlled are suitable.

The buffer layer according to the invention is advantageously applied on the absorber layer by atomic layer deposition (ALD), ion layer gas deposition (ILGAR), spray pyrolysis, chemical vapor deposition (CVD), or physical vapor deposition (PVD). The buffer layer according to the invention is preferably deposited by sputtering, thermal deposition, or electron beam deposition, particularly preferably from separate sources for sodium chloride and indium sulfide. Indium sulfide can be evaporated either from separate sources for indium and sulfur or from one source with an $In_2S_3$ compound semiconductor material. Other indium sulfides ($In_5S_6/S_7$ or InS) are also possible in combination with a sulfur source.

The buffer layer according to the invention is advantageously deposited with a vacuum method. The vacuum method has the particular advantage that, under a vacuum, the incorporation of oxygen or hydroxide is prevented. Hydroxide components in the buffer layer are believed to be responsible for transients in efficiency under the effect of heat and light. Moreover, the vacuum methods have the advantage that the method does without wet chemistry and standard vacuum coating equipment can be used.

In a particularly advantageous embodiment of the method according to the invention, sodium chloride is evaporated from one source and indium sulfide ($In_2S_3$) from a separate, second source. The arrangement of the deposition sources is preferably implemented such that the steam beams of the sources overlap. In the context of the present application, "steam beam" means the region in front of the outlet of the source that is technically suitable for the deposition of the evaporated material on a substrate in terms of deposition rate and homogeneity. The source is, for example, an effusion cell, a boat or crucible of a thermal evaporator, a resistance heater, an electron beam evaporator, or a linear evaporator.

In an advantageous embodiment of the method according to the invention, the absorber layer is conveyed past steam beams of sodium chloride and steam beams of indium sulfide or indium and sulfur in an in-line method or in a rotation method. The steam beams preferably overlap completely or partially.

In an alternative embodiment of the method according to the invention, in the second step b), a sodium chloride compound is first deposited on the absorber layer. For example, sodium chloride is evaporated out of an effusion cell. The amount of sodium chloride evaporated is controlled by opening and closing an aperture or by temperature control. Then, in a further step, a buffer layer of indium sulfide is deposited, preferably without vacuum interruption, on the absorber layer coated with sodium chloride.

Another aspect of the invention comprises the use of a layer system according to the invention in a thin-film solar cell or a solar module.

Figure 2:
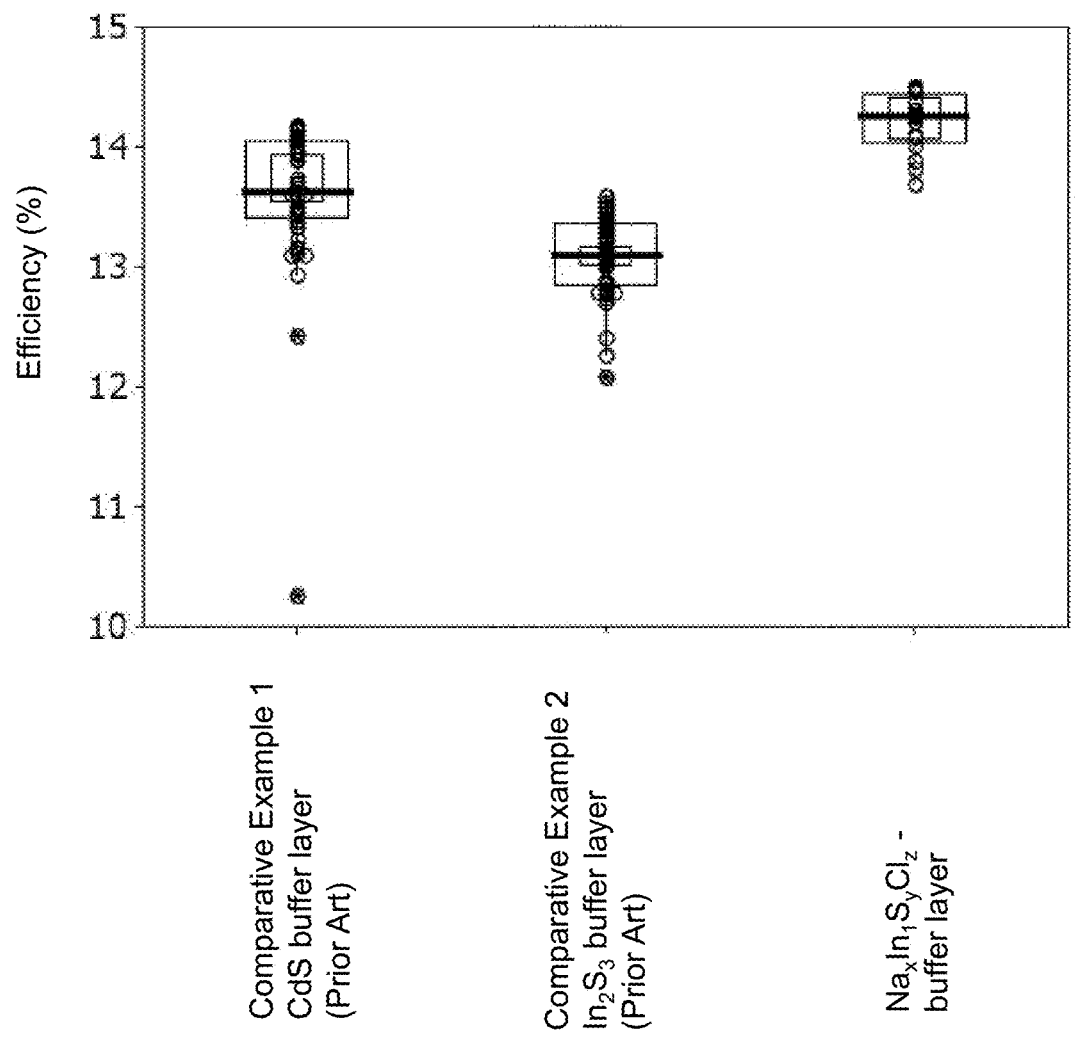
Figure 3:
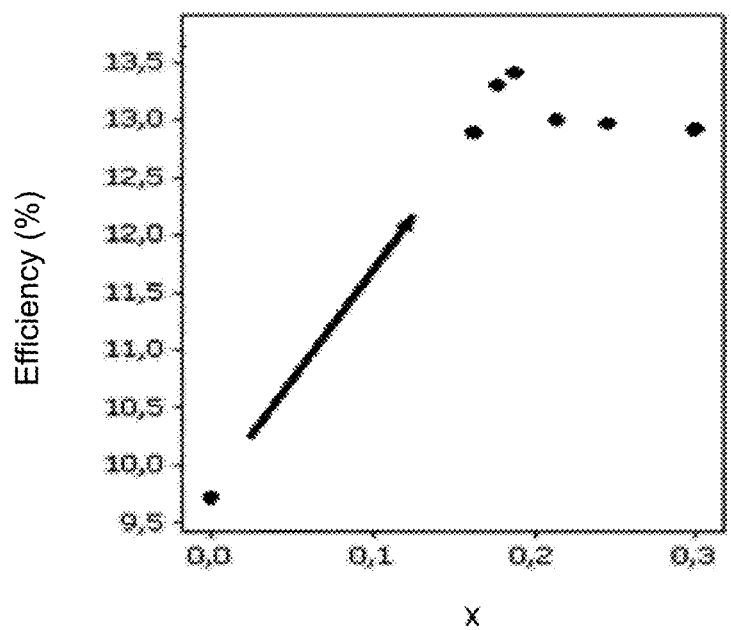
Figure 3:
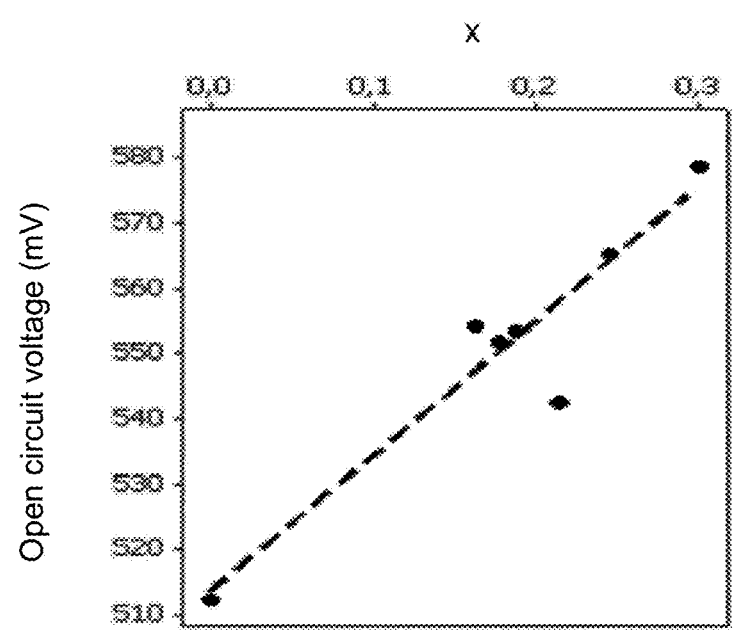
Figure 4:
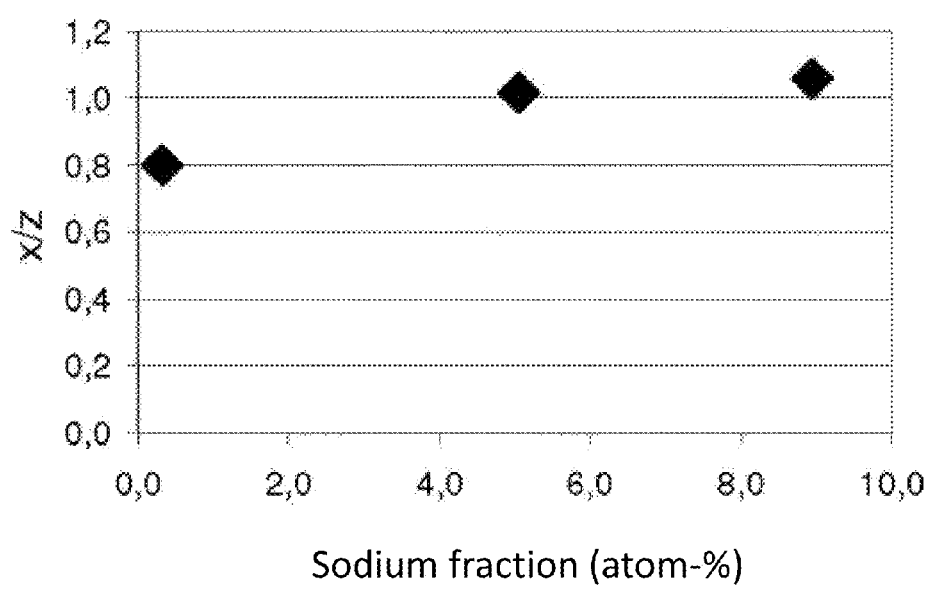
Figure 5:
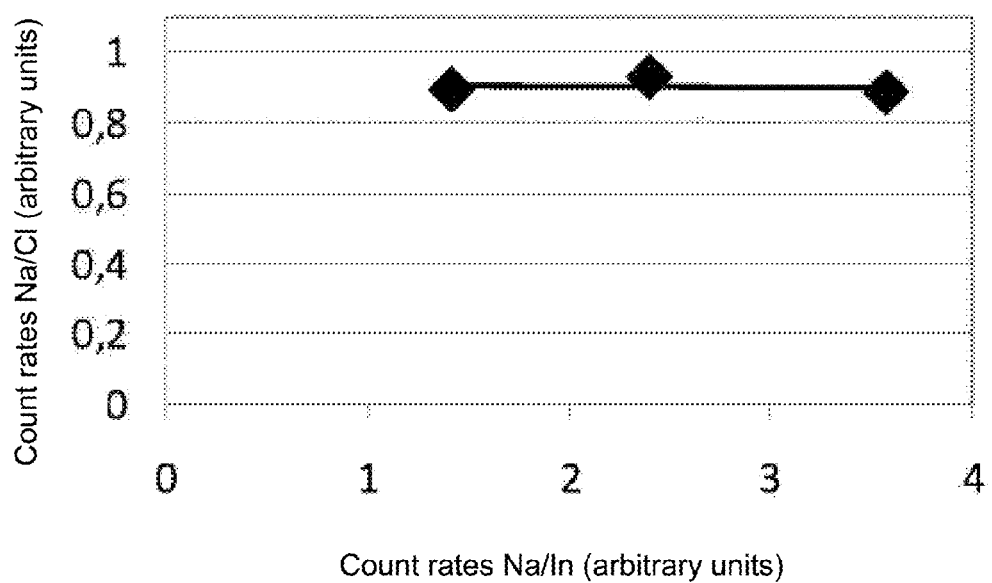
Figure 6:
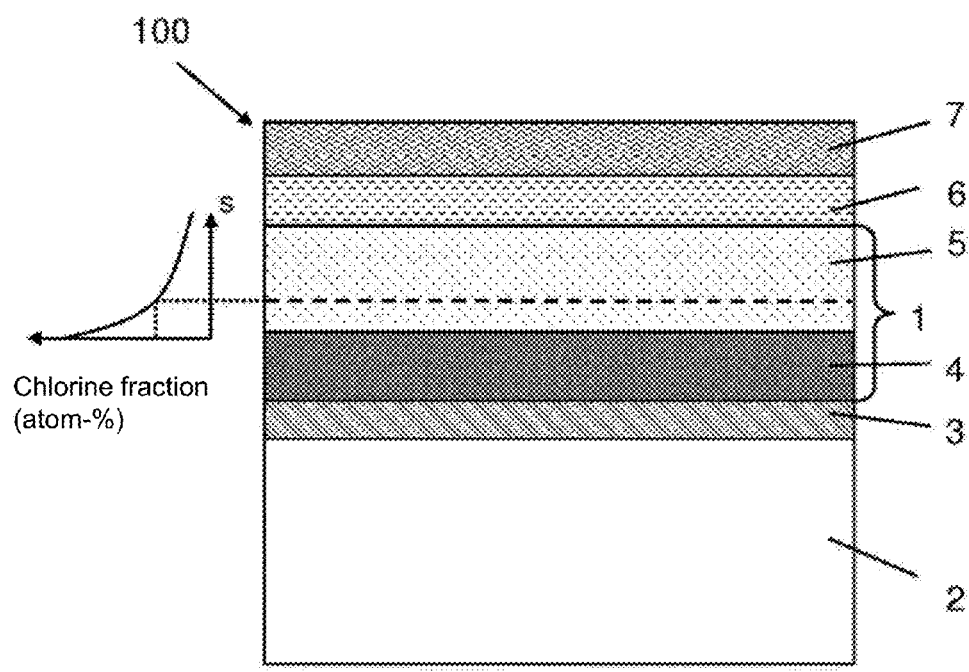
Figure 7:
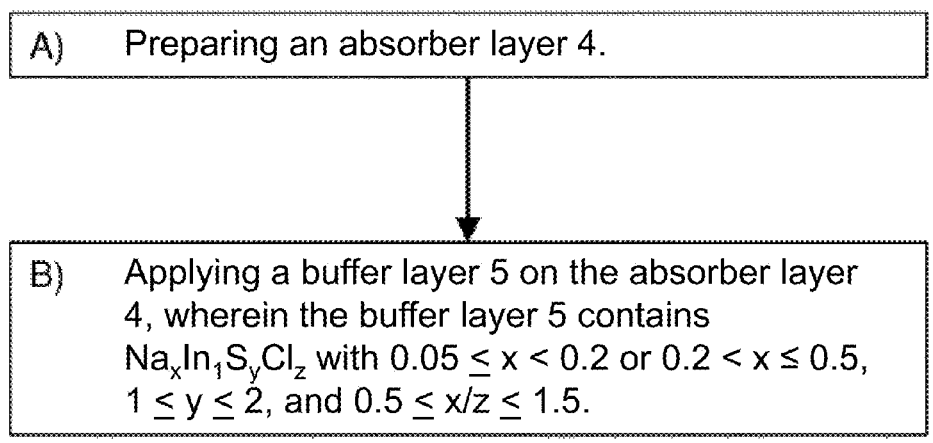
Figure 8:
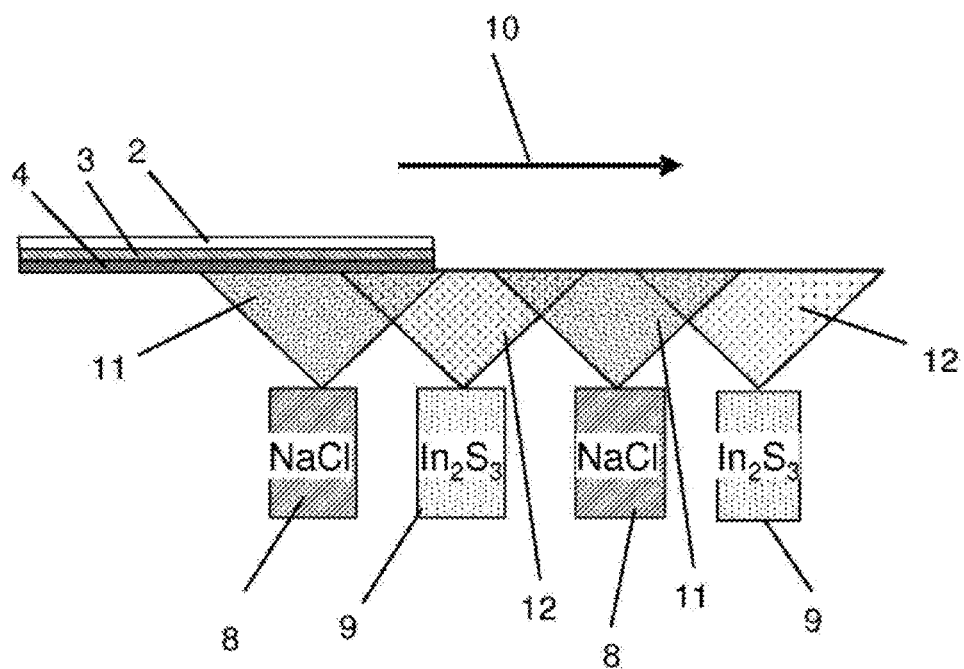
Figure 9:
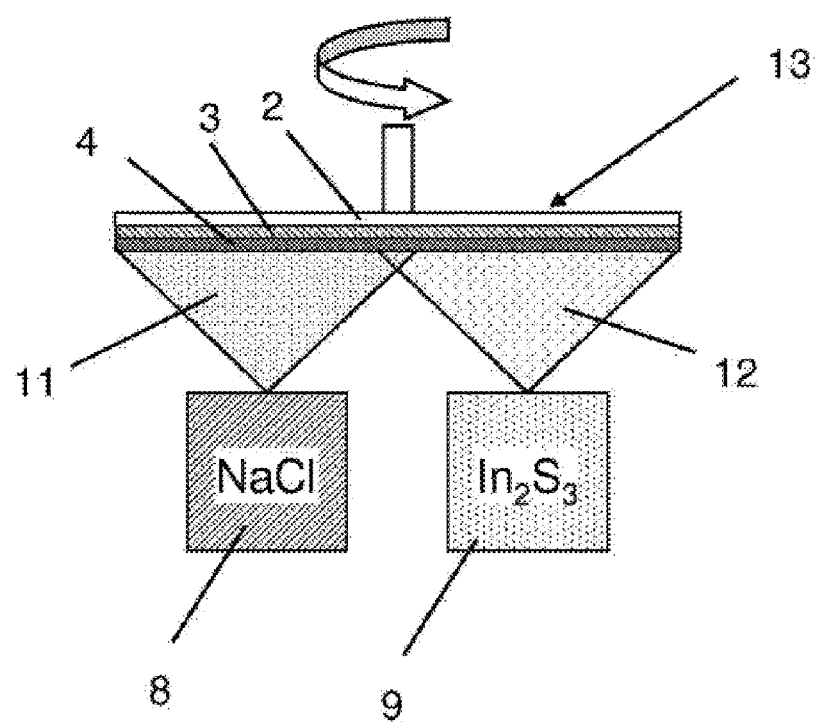

The invention is explained in detail in the following with reference to drawings and an example. The drawings are not completely true to scale. The invention is in no way restricted by the drawings. They depict:

FIG. 1 a schematic cross-sectional view of a thin-film solar cell according to the invention with a layer system according to the invention, FIG. 2 a measurement of efficiency on a layer system according to the invention with a comparative example, FIG. 3A a measurement of efficiency on layer systems according to the invention, FIG. 3B a measurement of the open circuit voltage on layer systems according to the invention, FIG. 4 a measurement of the ratio of sodium to chlorine on buffer layers according to the invention, FIG. 5 a measurement of the ratio of sodium to chlorine on layer systems according to the invention, FIG. 6 a schematic cross-sectional view of an improvement of a layer system according to the invention, FIG. 7 an exemplary embodiment of the process steps according to the invention with reference to a flow diagram, FIG. 8 a schematic depiction of an in-line method for producing a buffer layer according to the invention, and FIG. 9 a schematic depiction of a rotation method for producing a buffer layer according to the invention.

FIG. 1 depicts, purely schematically, a preferred exemplary embodiment of a thin-film solar cell 100 according to the invention with a layer system 1 according to the invention in a cross-sectional view. The thin-film solar cell 100 includes a substrate 2 and a rear electrode 3. A layer system 1 according to the invention is arranged on the rear electrode 3. The layer system 1 according to the invention comprises an absorber layer 4 and a buffer layer 5. A second buffer layer 6 and a front electrode 7 are arranged on the layer system 1.

The substrate 2 is made here, for example, of inorganic glass, with it equally possible to use other insulating materials with sufficient stability as well as inert behavior relative to the process steps performed during the production of the thin-film solar cell 100, for example, plastics, in particular polymers or metals, in particular metal alloys. Depending on the layer thickness and the specific material properties, the substrate 2 can be implemented as a rigid plate or flexible film. In the present exemplary embodiment, the layer thickness of the substrate 2 is, for example, from 1 mm to 5 mm.

A rear electrode 3 is arranged on the light-entry side surface of the substrate 2. The rear electrode 3 is made, for example, of an opaque metal. It can, for example, be deposited on the substrate 2 by vapor deposition or magnetic field-assisted cathode sputtering. The rear electrode 3 is made, for example, of molybdenum (Mo), aluminum (Al), copper (Cu), titanium (Ti), or of a multilayer system with such a metal, for example, molybdenum (Mo). The layer thickness of the rear electrode 3 is, in this case, less than 1 μm, preferably in the range from 300 nm to 600 nm, and is, for example, 500 nm. The rear electrode 3 serves as a back-side contact of the thin-film solar cell 100. An alkali barrier, made, for example, of $Si_3N_4$, SiON, or SiCN, can be arranged between the substrate 2 and the rear electrode 3. This is not shown in detail in FIG. 1.

A layer system 1 according to the invention is arranged on the rear electrode 3. The layer system 1 includes an absorber layer 4, made, for example, of $Cu(In,Ga)(S,Se)_2$, which is applied directly on the rear electrode 3. The absorber layer 4 made of $Cu(InGa)(S,Se)_2$ was deposited, for example, in the RTP process described in the introduction. The absorber layer 4 has, for example, a thickness of 1.5 μm.

A buffer layer 5 is arranged on the absorber layer 4. The buffer layer 5 includes, for example, $Na_xIn_1S_yCl_z$ with $0.05 \leq x < 02$ or $0.2 < x \leq 0.5$, $1.3 \leq y \leq 1.5$, and $0.6 \leq x/z \leq 1.4$ and, for example, $Na_{0.2}In_1S_{1.4}Cl_{0.2}$. The layer thickness of the buffer layer 5 is from 20 nm to 60 nm and, for example, 30 nm.

A second buffer layer 6 can be arranged above the buffer layer 5. The buffer layer 6 includes, for example, non-doped zinc oxide (i-ZnO). A front electrode 7 that serves as a front-side contact and is transparent to radiation in the visible spectral range ("window layer") is arranged above the second buffer layer 6. Usually, a doped metal oxide (TCO=transparent conductive oxide), for example, n-conductive, aluminum (Al)-doped zinc oxide (ZnO), boron (B)-doped zinc oxide (ZnO), or gallium (Ga)-doped zinc oxide, is used for the front electrode 7. The layer thickness of the front electrode 7 is, for example, roughly 300 to 1500 nm. For protection against environmental influences, a plastic layer (encapsulation film) made, for example, of polyvinyl butyral (PVB), ethylene vinyl acetate (EVA), or DNP can be applied to the front electrode 7. In addition, a cover plate transparent to sunlight that is made, for example, from extra white glass (front glass) with a low iron content and has a thickness of, for example, 1 to 4 mm, can be provided.

The described structure of a thin-film solar cell or a thin-film solar module is well known to the person skilled in the art, for example, from commercially available thin-film solar cells or thin-film solar modules and has also already been described in detail in numerous printed documents in the patent literature, for example, in DE 19956735 B4.

In the substrate configuration depicted in FIG. 1, the back electrode 3 adjoins the substrate 2. It is understood that the layer structure 1 can also have a superstrate configuration, in which the substrate 2 is transparent and the front electrode 7 is arranged on a surface of the substrate 2 facing away from the light-entry side.

The layer system 1 can serve for producing integrated serially connected thin-film solar cells 100, with the layer system 1, the rear electrode 3, and the front electrode 7 patterned in a manner known per se by various patterning lines ("P1" for rear electrode, "P2" for front electrode/back electrode contact, and "P3" for separation of the front electrode).

FIG. 2 shows a diagram of the efficiency of thin-film solar cells 100 with the layer system 1 according to the invention and two comparative examples according to the prior art. The example according to the invention contains a thin-film solar cell 100 according to the structure from FIG. 1. The thin-film solar cell 100 contains a substrate 2 made of glass as well as a rear electrode 3 made of a $Si_3N_4$ barrier layer and a molybdenum layer. An absorber layer 4 made of $Cu(In,Ga)(S,Se)_2$ that was deposited according to the above-described RTP process is arranged on the rear electrode 3. An $Na_xIn_1S_yCl_z$ buffer layer 5 is arranged on the absorber layer 4. The layer thickness of the buffer layer 5 is 50 nm. A 100-nm-thick second buffer layer 6 that contains non-doped zinc oxide is arranged on the buffer layer 5. A 1200-nm-thick front electrode 7 that contains n-conductive zinc oxide is arranged on the second buffer layer 6. The surface area of the thin-film solar cell 100 is 1.4 $cm^2$. The cells with the $Na_xIn_1S_yCl_z$ buffer layer according to the invention were produced with 6.5 atom-% sodium from NaCl. The ratio y of the amounts of sulfur and indium was roughly 1.35. The ratio x of the amounts of sodium and indium was roughly 0.18. Based on experience, the ratio x/z of the amounts of sodium and chlorine in the production of the buffer layer 5 from sodium chloride is roughly 1.0. The characteristic data of the thin-film solar cell 100 indicate a high open circuit voltage $V_{oc}$ of 582 mV and a good filling factor FF of 70.8%. Measurements yielded a mean efficiency of 14.2% and a maximum efficiency of 14.5%. In FIG. 2, the mean efficiency is represented in each case by a black bar. The comparative example 1 contains a CdS buffer layer according to the prior art. Measurements on the comparative example 1 yielded a mean efficiency of 13.6% and a maximum efficiency of 14.2%. The comparative example 2 contains a buffer layer according to the prior art made of indium sulfide with a halogen content of <0.5 atom-% as an impurity from the starting material. Measurements on the comparative example 2 yielded a mean efficiency of 13.1% and a maximum efficiency of 13.6%. FIG. 2 shows that the example according to the invention has a clearly higher maximum efficiency and a clearly higher mean efficiency than the comparative examples 1 and 2 according to the prior art.

FIG. 3A shows measurements of the efficiency and FIG. 3B shows measurements of the open circuit voltage as a function of the index x, i.e., as a function of the ratio of the amounts of sodium and indium. The measurement at x=0 on a layer structure according to the prior art that contains no sodium in the buffer layer 5 serves as the comparative example. The efficiency of the comparative example is roughly 9.7% and the open circuit voltage roughly 512 mV. For layer structures 1 according to the invention with $0.1 \leq x < 0.2$ and $0.2 < x \leq 0.3$, it was unexpectedly possible to measure clearly higher efficiencies in the range from 12.9% to 13.4% and clearly higher open circuit voltages in the range from 540 mV to 578 mV. The layer structures 1 according to the invention presented clearly higher efficiencies than the comparative example.

FIG. 4 shows a measurement of the ratio x/z of the amounts of sodium to chlorine using Rutherford-Back-Scattering (RBS). For the analysis of the ratio, thin buffer layers with a layer thickness of roughly 40 nm were produced by co-deposition of indium sulfide with sodium chloride. The ratio x/z is plotted over the mole fraction of sodium in the buffer layer 5 in atom-%. For a large range of variation in the mole fraction of sodium from 0.3 atom-% to 9 atom-%, the ratio x/z changed only slightly. Thus, the ratio x/z for a sodium fraction of 5 atom-% is roughly 1.01 and four a sodium fraction of 9 atom-% roughly 1.06. It is possible to conclude that by deposition of sodium chloride, the sodium and the chlorine are incorporated into the indium sulfide in virtually the same ratio as in the starting material sodium chloride. The deviations of the ratio x/z from the value 1 can be caused by measurement or preparation errors, in particular since the layers are hygroscopic and very thin at roughly 40 nm.

FIG. 5 shows the ratio of sodium to chlorine for various amounts of sodium in a thin-film solar cell 100 according to the invention. For this, thin-film solar cells 100 were produced with a molybdenum-rear electrode 3, $Cu(In,Ga)(S,Se)_2$ absorber layer 4, $Na_xIn_1S_yCl_z$ buffer layer 5, and ZnO front electrode 7, wherein the sodium amount in the buffer layer 5 was varied. Then, the thin-film solar cells 100 were investigated with secondary ion mass spectrometry (SIMS). The element profiles were recorded through the entire cell and the count rates integrated. The SIMS count rate ratio for sodium/chlorine is plotted on the vertical axis. The sodium count rate minus the sodium amount of the absorber layer 4 is plotted on the horizontal axis. FIG. 5 shows a virtually constant count rate ratio of sodium/chlorine for different introduced amounts of sodium. The ratio of sodium and chlorine is constantly within the scope of measurement accuracy and is independent of the fraction of sodium introduced. This can be explained by the fact that the sodium fraction in the absorber layer 4 is small compared to the sodium fraction in the buffer layer 5 and little or no amounts of sodium diffuse out of the absorber layer 4 or the substrate 2 into the buffer layer 5. At the same time, little or no outward diffusion of sodium out of the buffer layer 5 occurs. The ratio value plotted in FIG. 5 is not a mole ratio and is plotted in arbitrary units since the count rates are not calibrated.

FIG. 6 shows an alternative embodiment of a thin-film solar cell 100 according to the invention with a layer structure 1 according to the invention. Substrate 2, rear electrode 3, absorber layer 4, second buffer layer 6, and front electrode 7 correspond to the statements under FIG. 1. The buffer layer 5 has a gradient in the chlorine fraction over the layer thickness s of the buffer layer 5. The chlorine fraction describes the fraction of all chlorine atoms present in the buffer layer 5 regardless of their oxidation state.

FIG. 7 depicts a flow diagram of a method according to the invention. In a first step, an absorber layer 4 is prepared, for example, from a $Cu(In,Ga)(S,Se)_2$ semiconductor material. In a second step, the buffer layer 5 of sodium and chlorine, for example, of sodium chloride, and indium sulfide is deposited. The ratio of the individual components in the buffer layer 5 is regulated, for example, by control of the deposition rate, for example, by an aperture or by temperature control.

In further process steps, a second buffer layer 6 and a front electrode 7 can be deposited on the buffer layer 5. In addition, connecting and contacting of the layer structure 1 to form a thin-film solar cell 100 or a solar module can take place.

FIG. 8 depicts a schematic representation of an in-line method for producing a buffer layer 5 according to the invention made of $Na_xIn_1S_yCl_z$. In an in-line method, the substrate 2 with rear electrode 3 and absorber layer 4 is conveyed past the steam beams 11,12 of, for example, two sodium chloride sources 8 and two indium sulfide sources 9. The transport direction is indicated by an arrow with the reference character 10. The sources 8,9 are arranged alternatingly, with the steam beams 11 of the sodium chloride sources 8 and the steam beams 12 of the indium sulfide sources 9 overlapping. In this manner, the absorber layer 4 is coated with multiple thin layers of sodium chloride and indium sulfide which blend. The sodium chloride source 8 and the indium sulfide source 9 are, for example, effusion cells, from which sodium chloride or indium sulfide is thermally vaporized. Alternatively, any other form of generation of steam beams 11,12 for the deposition of the buffer layer 5 is suitable, so long as the ratio of the mole fractions of sodium, chlorine, indium, and sulfur can be controlled. Alternative sources are, for example, boats from linear evaporators or crucibles from electron beam evaporators.

In an alternative device for performance of the method according to the invention, a plurality of sources of sodium chloride 8 and indium sulfide 9 are alternatingly arranged two-dimensionally, for example, in a checkerboard arrangement.

FIG. 9 depicts another alternative embodiment of the method according to the invention using the example of a rotation method. The substrate 2 with rear electrode 3 and absorber layer 4 is arranged on a rotatable specimen support 13, for example, on a specimen carousel. Alternatingly arranged sources of sodium chloride 8 and indium sulfide 9 are situated below the specimen support 13. During the deposition of the buffer layer 5 according to the invention, the specimen support 13 is rotated. Thus, the substrate 2 is moved into the steam beams 11, 12 and coated.

Both in the lab process with a rotating substrate 2 on a rotatable specimen support 13 and in the industrial in-line method with linear feed of the substrate 2 under evaporator sources with sodium chloride 8 and indium sulfide 9, the deposition rates and the arrangement of the sources 8, 9 can be selected such that the absorber layer 4 is first coated with an elevated fraction of sodium chloride. This can result in the formation of an advantageous chlorine gradient in the buffer layer 5 on the interface with the absorber layer 4, as is depicted in FIG. 6.

The introduction of sodium and chlorine from sodium chloride into the indium sulfide buffer layer 5 has multiple special advantages. Sodium chloride is non-toxic and economical and can, as already mentioned, be readily applied using thermal methods. During thermal deposition, sodium chloride evaporates as NaCl molecules and does not dissociate to sodium and chlorine. This has the particular advantage that during evaporation, no toxic and corrosive chlorine develops.

The introduction of sodium and chlorine from sodium chloride offers additional advantages from a production technology standpoint. Only one substance has to be evaporated, greatly simplifying the process compared to possible mixtures of substances such as $NaCl/ZnS/In_2S_3$. The vapor pressure curve of sodium is known, for example, from C. T. Ewing, K. H. Stern, "Equilibrium Vaporization Rates and Vapor Pressures of Solid and Liquid Sodium Chloride, Potassium Chloride, Potassium Bromide, Cesium Iodide, and Lithium Fluoride", J. Phys. Chem., 1974, 78, 20, 1998-2005, and a thermal vapor deposition process can be readily controlled by temperature. Moreover, an arrangement for vapor deposition of sodium chloride can be readily integrated into existing thermal indium sulfide coating equipment.

From the above assertions, it has become clear that by means of the present invention the disadvantages of previously used CdS buffer layers or the alternative buffer layers were overcome in thin-film solar cells, with the efficiency and the stability of the thin-film solar cells produced therewith also very good or better. At the same time, the production method is economical, effective, and environmentally safe.

It has been demonstrated that with the layer system according to the invention, good solar cell characteristics comparable to those with conventional CdS buffer layers can be obtained. With the structure according to the invention, it was possible to obtain high efficiencies up to 14.5%. This was unexpected and surprising for the person skilled in the art.

LIST OF REFERENCE CHARACTERS

1 layer system
2 substrate
3 rear electrode
4 absorber layer
5 buffer layer
6 second buffer layer
7 front electrode
8 sodium chloride source
9 indium sulfide source
10 transport direction
11 sodium chloride steam beam
12 indium sulfide steam beam
100 thin-film solar cell
s layer depth

The invention claimed is:

1. Layer system for thin-film solar cells, comprising:
   an absorber layer that contains a chalcogenide compound semiconductor,
   a buffer layer that is arranged on the absorber layer, wherein the buffer layer contains $Na_xIn_1S_yCl_z$ with $0.05 \leq x < 0.2$ or $0.2 < x \leq 0.5$,
   $0.6 \leq x/z \leq 1.4$, wherein $0.05 < x < 0.2$ or $0.2 < x \leq 0.5$ and $1 \leq y \leq 2$.

2. Layer system according to claim 1, wherein $0.1 \leq x < 0.2$ or $0.2 < x \leq 0.3$.

3. Layer system according to claim 1, wherein $0.8 \leq x/z \leq 1.2$.

4. Layer system according to claim 1, wherein $1.3 \leq y \leq 1.5$.

5. Layer system according to claim 1, wherein the buffer layer has a layer thickness from 10 nm to 100 nm.

6. Layer system according to claim 1, wherein the buffer layer contains a fraction of oxygen $\leq 10$ atom-% and/or a fraction of copper $\leq 10$ atom-%.

7. Layer system according to claim 1, wherein the fraction of sodium and chlorine in the buffer layer has a non-constant depth profile.

8. Layer system according to claim 7, wherein the mole fraction of sodium and chlorine in the buffer layer has a decreasing gradient from the surface facing the absorber layer to the interior of the buffer layer.

9. Layer system according to claim 1, wherein the chalcogenide compound semiconductor contains $Cu_2ZnSn(S,Se)_4$, $Cu(In,Ga,Al)(S,Se)_2$.

10. Thin-film solar cell, comprising:
    a substrate,
    a rear electrode that is arranged on the substrate,
    a layer system according to claim 1, that is arranged on the rear electrode, and
    a front electrode that is arranged on the layer system.

11. Thin-film solar cell according to claim 10, wherein a second buffer layer is arranged between a first buffer layer and the front electrode.

12. Method for producing a layer system for thin-film solar cells, wherein
    a) an absorber layer that contains a chalcogenide compound semiconductor is prepared and
    b) a buffer layer is arranged on the absorber layer,
       wherein the buffer layer contains $Na_xIn_1S_yCl_z$ with $0.05 \leq x < 0.2$ or $0.2 < x \leq 0.5$,
       $0.6 \leq x/z \leq 1.4$, wherein $0.05 < x < 0.2$ or $0.2 < x \leq 0.5$, and $1 \leq y \leq 2$.

13. Method according to claim 12, wherein in the step b) sodium chloride and indium sulfide are applied on the absorber layer by atomic layer deposition (ALD), ion layer gas deposition (ILGAR), spray pyrolysis, chemical vapor deposition (CVD), physical vapor deposition (PVD), sputtering, thermal deposition, or electron beam deposition.

14. Method according to claim 12, wherein the absorber layer is conveyed past at least one steam beam of sodium chloride and at least one steam beam of indium sulfide in an in-line method or a rotation method.

15. Layer system according to claim 1, wherein the buffer layer has a layer thickness from 20 nm to 60 nm.

16. Layer system according to claim 1, wherein the chalcogenide compound semiconductor contains $CuInSe_2$, $CuInS_2$, $Cu(In,Ga)Se_2$, or $Cu(In,Ga)(S,Se)_2$.

17. Thin-film solar cell according to claim 10, wherein a second buffer layer is arranged between a first buffer layer and the front electrode and the second buffer layer contains non-doped zinc oxide and/or non-doped zinc magnesium oxide.

18. Method according to claim 12, wherein in the step b) sodium chloride and indium sulfide are applied from separate sources for sodium chloride and for indium sulfide.

19. Method according to claim 12, wherein the absorber layer is conveyed past at least one steam beam of sodium chloride and at least one steam beam of indium sulfide in an in-line method or a rotation method and the steam beams overlap partially.

* * * * *